(12) United States Patent
Forbes

(10) Patent No.: US 7,151,024 B1
(45) Date of Patent: Dec. 19, 2006

(54) LONG RETENTION TIME SINGLE TRANSISTOR VERTICAL MEMORY GAIN CELL

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/215,880

(22) Filed: Aug. 30, 2005

Related U.S. Application Data

(62) Division of application No. 10/933,814, filed on Sep. 2, 2004.

(51) Int. Cl.
*H01L 21/8242* (2006.01)

(52) U.S. Cl. .................. 438/242; 438/596; 438/270

(58) Field of Classification Search ........ 257/296–313; 438/239, 242, 243, 246
See application file for complete search history.

(56) References Cited

U.S. PATENT DOCUMENTS

| | | | |
|---|---|---|---|
| 5,414,287 A | 5/1995 | Hong | |
| 5,416,350 A | 5/1995 | Watanabe | |
| 5,465,249 A | 11/1995 | Cooper, Jr. et al. | |
| 5,510,630 A | 4/1996 | Agarwal et al. | |
| 5,936,274 A | 8/1999 | Forbes et al. | |
| 5,973,356 A | 10/1999 | Noble et al. | |
| 5,991,225 A | 11/1999 | Forbes et al. | |
| 6,072,209 A | 6/2000 | Noble et al. | |
| 6,090,661 A * | 7/2000 | Perng et al. | 438/248 |
| 6,097,065 A | 8/2000 | Forbes et al. | |
| 6,124,729 A | 9/2000 | Noble et al. | |
| 6,143,636 A | 11/2000 | Forbes et al. | |
| 6,150,687 A | 11/2000 | Noble et al. | |
| 6,153,468 A | 11/2000 | Forbes et al. | |
| 6,174,780 B1 | 1/2001 | Robinson | |
| 6,238,976 B1 | 5/2001 | Noble et al. | |
| 6,246,083 B1 | 6/2001 | Noble | |
| 6,352,864 B1 | 3/2002 | Lee | |
| 6,538,916 B1 | 3/2003 | Ohsawa | |
| 6,617,651 B1 | 9/2003 | Ohsawa | |
| 6,661,042 B1 | 12/2003 | Hsu | |
| 6,891,225 B1 * | 5/2005 | Horiguchi et al. | 257/331 |
| 2002/0024081 A1 | 2/2002 | Gratz | |
| 2002/0028541 A1 | 3/2002 | Lee et al. | |
| 2002/0038886 A1 | 4/2002 | Mo | |
| 2004/0042256 A1 | 3/2004 | Forbes | |

(Continued)

OTHER PUBLICATIONS

U.S. Appl. No. 10/739,253, filed Dec. 18, 2003, Leonard Forbes.

(Continued)

*Primary Examiner*—George R. Fourson
*Assistant Examiner*—John M. Parker
(74) *Attorney, Agent, or Firm*—Knobbe, Martens, Olson & Bear LLP

(57) ABSTRACT

A single transistor vertical memory gain cell with long data retention times. The memory cell is formed from a silicon carbide substrate to take advantage of the higher band gap energy of silicon carbide as compared to silicon. The silicon carbide provides much lower thermally dependent leakage currents which enables significantly longer refresh intervals. In certain applications, the cell is effectively non-volatile provided appropriate gate bias is maintained. N-type source and drain regions are provided along with a pillar vertically extending from a substrate, which are both p-type doped. A floating body region is defined in the pillar which serves as the body of an access transistor as well as a body storage capacitor. The cell provides high volumetric efficiency with corresponding high cell density as well as relatively fast read times.

3 Claims, 11 Drawing Sheets

U.S. PATENT DOCUMENTS

2004/0108532 A1    6/2004    Forbes
2004/0174734 A1    9/2004    Forbes

OTHER PUBLICATIONS

U.S. Appl. No. 10/808,058, filed Mar. 24, 2004, Leonard Forbes.

P. Fazan et al., "Capacitor-less 1-transistor DRAM", IEEE International SOI Conference, 2002, pp. 10-13.

P.C. Fazan et al., "A simple 1-transistor capacitor-less memory cell for high peformance embedded DRAMs", Proceedings of the IEEE Custom integrated Circuits Conference 2002, pp. 99-102.

A.K. Ararwal et al., "SiC Electronics", International Electron Devices Meeting Technical Digest, 1996, p. 225.

Sima Dimitrijev et al., "Charge retention in metal-oxide-semiconductor capacitors on SiC used as nonvolatile-memory elements", Applied Physics Letters, vol. 80, No. 18, pp. 3421-3423, May 6, 2002.

T. Ohsawa et al., "Memory Design Using a One-Transistor Gain Cell on SOI", IEEE Journal of Solid-State Circuits, vol. 37, No. 11, pp. 1510-1522, Nov. 2002.

Paul Kallender, "Swiss team develops single-transistor SOI DRAM cell", http://www.eetimes.com/story/OEG20011016S0099, Oct. 16, 2001.

T. Ohsawa et al., "Memory Design Using One-Transistor Gain Cell on SOI", IEEE Int. Solid State Circuits Conference, San Francisco, 2002, pp. 152-153.

T. Ohsawa et al., "A Memory Using One-Transistor Gain Cell on SOI(FBC) with Performance Suitable for Embedded DRAM's" Symposium on VLSI Circuits, Jun. 12-14, 2003, pp. 93-96.

* cited by examiner

LONG RETENTION TIME SINGLE TRANSISTOR VERTICAL MEMORY GAIN CELL

RELATED APPLICATIONS

This application is a divisional of U.S. patent application Ser. No. 10/933,814, filed Sep. 2, 2004, which is incorporated herein in its entirety by reference.

BACKGROUND OF THE INVENTION

1. Field of the Invention

The invention relates to the field of semiconductor transistors and more particularly to a single transistor memory gain cell with long retention times.

2. Description of the Related Art

Semiconductor memory devices are widely employed in a wide variety of electronic devices such as consumer electronics, computer systems, etc. The semiconductor memory devices can provide storage capacity for operating software as well as data storage, such as for text files, audio/video files, etc. A popular and commonly employed type of memory is known as dynamic random access memory (DRAM). DRAM provides the advantage of relatively rapid ability to write and read data as well as a relatively simple circuit design which facilitates relatively high circuit density and corresponding large memory capacity.

FIG. 1 is a cross-sectional view of a typical prior art DRAM array where a plurality of individual DRAM cells are arrayed to define a memory circuit. These prior art DRAM cells are formed in a silicon-on-insulator (SOI) substrate where an active layer of silicon overlies an underlying buried oxide (BOX) layer. Alternating n-type and p-type regions are formed in the active layer with gate stacks formed to overlie the p-type regions so as to define an n-type metal oxide semiconductor (NMOS) transistor. The p-type regions are also isolated by the n-type regions disposed on either side and the underlying BOX layer to define floating bodies. As can be seen in FIG. 1, a generally planar structure is defined where the various components of the memory cells are aligned in a generally horizontal manner along the major plane of the SOI upon which the devices are made.

The usual utilization for the DRAM array is to interconnect the drain regions along a first direction with a bit/data line and the gates along a second direction via corresponding word lines such that an individual cell can be accessed by addressing the corresponding bit/data line and word line to read from, or write to, the individual cell where the bit/data line and word line intersect. The DRAM cell also typically includes a capacitor structure (not shown) to which the NMOS transistor is connected. The capacitor stores charge to define the logic state of the particular cell. The NMOS transistor acts as an access transistor such that by selecting a given access transistor, the charge storage state of the associated capacitor can be determined. An operational consideration of the DRAM cell is that, in silicon technologies, the thermally dependent carrier generation rate is such that the charge stored on the capacitor will leak over time so as to lose the stored logic state. Thus, the stored charge defining the stored data must be periodically refreshed. This is a well known and accepted characteristic of DRAM technology, however it would be advantageous if the speed, density, and writability advantages of the DRAM configuration could be maintained while eliminating the overhead and complication of performing the refresh operations.

There is also a continuing desire in the field for increased storage capacity of memory devices, such as DRAM memory, as well as a corresponding desire for increased speed of operation. This is frequently addressed by reducing the physical size of individual memory cells (scaling), thus allowing a greater circuit density and device count for a given area of semiconductor substrate in which the individual devices are formed. However, there are ever-present limitations to the degree to which further reduction in size and corresponding increase in the total count and density of individual devices may be practically realized with current semiconductor processing technologies.

One way of addressing these limitations is to employ innovative device architectures which may facilitate fabricating individual devices of reduced size. Examples of this can be described with the explanatory vehicle of a DRAM cell. A typical DRAM cell includes a single n-type metal oxide semiconductor (NMOS) transistor connected to a separate charge storage device, such as a capacitor. Thus, scaling to reduce the size of the DRAM cell involves scaling both the NMOS transistor and the capacitor charge storage device. Efforts have been made to further reduce the footprint, or amount of the planar surface of the substrate occupied by the DRAM cell, by incorporating vertical structures in the DRAM cell. For example, transistors and capacitor structures are known which extend vertically upwards from the substrate or downwards into the substrate, such as with a trench structure. Scaling however can lead to difficulties in operation of the devices as reduction in the size of the capacitor, as well as reduction in operating voltages reduces the available electrical signal output from the memory cells making reliable read/write operations to the memory cells more difficult. An additional difficulty is that with the reduced physical size and operating voltages attendant to scaling, so-called soft errors can more frequently arise when incident radiation, such as alpha particles, activates charge carriers in the cell structure which can lead to errors in the proper read/write of the intended logic state of an individual device.

A further difficulty is that trench capacitors formed in the trenches in the semiconductor substrate are subject to trench-to-trench charge leakage enabled by the parasitic transistor effect between adjacent trenches. As the fabrication dimensions are reduced, this leakage effect is enhanced which can drain the capacitor leading to a loss of stored data. Also, incident alpha particle radiation can generate whole/electron pairs in the semiconductor substrate which functions as one of the storage plates of the trench capacitors. This can also cause charge stored on the affected capacitor to dissipate, leading to the aforementioned soft errors. Stacked capacitors of a sufficient capacitance for reliable cell operation present a substantial vertical extent, thus also limiting further reductions in total cell size while maintaining reliable cell operation.

It will thus be appreciated that there is a continuing need for innovative memory cell architectures which can satisfy the continuing demand for reduced cell size and corresponding increase in device count and density while maintaining reliable device operation and feasible and economical fabrication. There is also a need for cell architectures of reduced dimensions which are resistant to errors, such as the soft errors induced by incident alpha particle radiation. There is also a desire for a writable memory technology that could eliminate the need for or substantially extend the intervals between refresh operations.

SUMMARY OF THE INVENTION

Preferred embodiments take advantage of the material properties of silicon carbide as a semiconductor material. Silicon carbide has a significantly higher band gap energy $E_g$ than silicon (3.25 eV vs. 1.12 eV) as well as higher saturated electron velocities and breakdown field strengths. Silicon carbide thus has a rate of thermally generated leakage currents that are practically negligible in silicon carbide as compared to silicon and can provide higher current densities. Preferred embodiments comprise a vertically arranged memory cell formed from silicon carbide rather than from the conventional silicon. The significantly higher band gap energy of silicon carbide as compared with silicon provides a memory cell with significantly less leakage current that comparable silicon based devices so that retention times of stored data is increased. Memory cells of preferred embodiments are substantially non-volatile as compared to silicon based devices, assuming appropriate bias voltage is maintained.

Preferred embodiments also provide pillars which extend vertically from the silicon carbide substrate and which are doped such that a floating body region is defined within the pillar. The floating body provides both the body of a metal oxide semiconductor type transistor which acts as an access transistor as well as a plate of a body capacitor. Charge stored within the floating body defines the stored logic state of the cell. In more preferred embodiments, the cells can also function as gain cells with respect to charge stored on the floating body. A relatively small charge stored in the floating body can correspond to a relatively large increase in the forward current through the transistor structure with a given gate bias. The architecture of the preferred embodiments also provides an efficient volumetric use of the substrate material so as to provide a high cell density as well as a reduced susceptibility to soft errors, such as induced by incident alpha particle radiation.

One embodiment comprises a memory cell comprising a substrate comprising silicon carbide of a first conductivity type, a pillar comprising silicon carbide of the first conductivity type extending vertically upward from the substrate, a source region comprising silicon carbide of a second conductivity type formed in the substrate adjacent a base of the pillar, a drain region comprising silicon carbide of the second conductivity type formed in an upper region of the pillar, a gate dielectric and conductor arranged along a first side of the pillar, and a capacitor dielectric and body capacitor plate arranged along an opposite, second side of the pillar.

Another embodiment comprises an array of memory cells comprising a substrate comprising silicon carbide of a first conductivity type, an arrayed plurality of pillars comprising silicon carbide of the first conductivity type extending vertically upward from the substrate, source lines comprising silicon carbide of a second conductivity type formed in the substrate extending in a first direction along bases of the pillars, drain regions comprising silicon carbide of the second conductivity type formed in upper regions of the pillar, data/bit lines interconnecting a plurality of corresponding drain regions and extending in a second direction, gate dielectric and conductors arranged along first sides of the pillars, word lines interconnecting corresponding gate conductors and extending in the first direction, and capacitor dielectric and body capacitor plates arranged along opposite, second sides of the pillars.

Yet another embodiment comprises a memory cell comprising a vertically extending pillar comprising silicon carbide, a source region formed in a silicon carbide substrate so as to be adjacent a base of the pillar, a drain region formed in an upper region of the pillar, a gate dielectric and conductor arranged along a first side of the pillar, and a capacitor dielectric and body capacitor plate arranged along an opposite, second side of the pillar wherein charge stored within the pillar determines conductivity between the drain and source regions so as to define a logic state of the cell.

A further embodiment comprises a method of forming memory cells comprising patterning and etching a substrate comprising silicon carbide doped a first conductivity type so as to form trenches extending along intersecting first and second directions so as to define a plurality of vertically extending pillars, filling the trenches with insulator, selectively removing the insulator from trenches extending in the first direction, doping upper regions of the pillars and the trenches extending in the first direction with dopant of a second conductivity type so as to define drain regions and source lines respectively, depositing gate dielectric along first sides of the pillars, depositing capacitor dielectric along opposed second sides of the pillars, forming conductive word lines extending along the first direction atop the gate dielectric, forming body capacitor plates atop the capacitor dielectric, and forming data/bit lines interconnecting drain regions along the second direction.

These and other objects and advantages of the present invention will become more fully apparent from the following description taken in conjunction with the accompanying drawings.

DETAILED DESCRIPTION OF THE PREFERRED EMBODIMENTS

Figure 1:
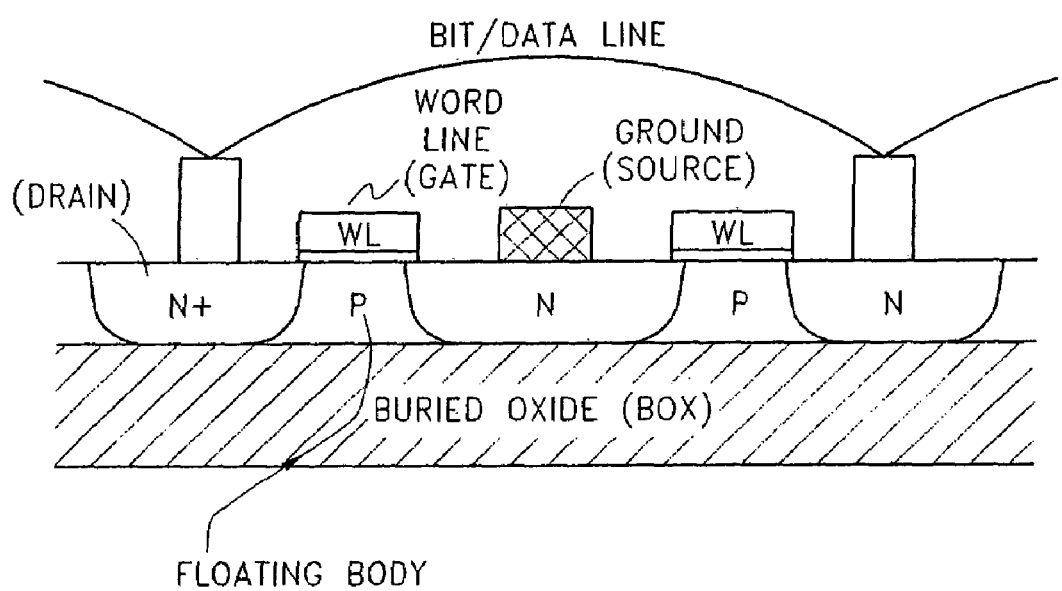
FIG. 1 is a section view of typical prior art SOI floating body DRAM cells.

Reference will now be made to the drawings wherein like reference numerals refer to like structures and materials throughout. It will be understood that the figures are provided for illustrative purposes for the various embodiments described herein and should not be interpreted as being to scale or illustrating precise quantitative or proportional relationships.

Figure 2:
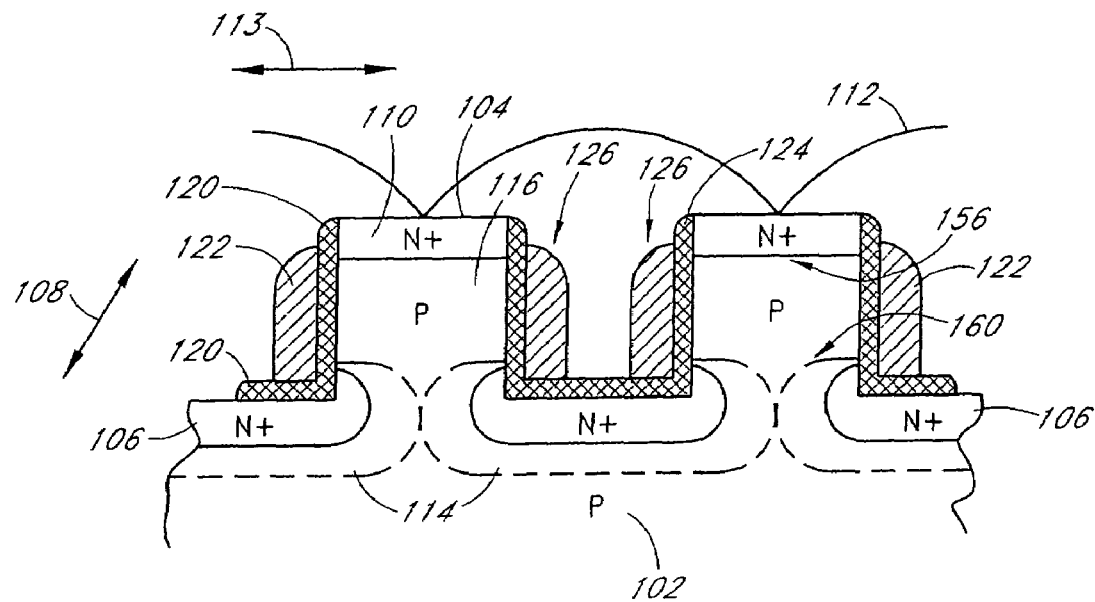
FIG. 2 is a section view of one embodiment of vertical memory gain cells with long retention times.

FIG. 2 illustrates, in cross-sectional view, one embodiment of a single transistor memory gain cell 100. The cell 100 provides a readily fabricatable high-density memory gain cell with relatively long retention times that can facilitate extremely high device densities and is resistant to soft errors, such as from incident alpha particle radiation. The structure, operation of, and fabrication of the cell 100 will be described in this embodiment with analogy to an n-type metal oxide semiconductor (NMOS) transistor for ease of understanding. However, it will be understood that in other embodiments, an analogous complimentary p-type (PMOS) embodiment can be equally realized, as well as a combined n-type and p-type (CMOS) embodiment employing the teachings herein.

In this embodiment, the cell 100 comprises a substrate 102 which, in this embodiment, comprises 4H or 6H silicon carbide p-type doped with boron at approximately $10^{14}/cm^3$. The cell 100 also comprises a generally vertically extending pillar 104 which, in this embodiment, also comprises silicon carbide doped p-type similarly to the substrate 102. Source lines 106 are also formed at an upper region of the substrate 102 so as to extend generally in a first direction 108 substantially along the view of the cross-sectional illustration of FIG. 2 or substantially into and out of the page. The source lines 106 in this embodiment, are positioned adjacent a base of the pillars 104 and are further arranged so as to be substantially not underlying the pillars 104, but rather extending substantially between adjacent pillars 104. In this embodiment, the source lines 106 comprise regions of the substrate 102 which have been relatively heavily doped n-type and, in this embodiment, approximately at greater than $10^{19}/cm^3$ with nitrogen.

Drain regions 110 are also formed at upper regions of the pillars 104. In this embodiment, the drain regions 110 comprise these upper portions of the pillars 104 having been doped n-type approximately at greater than $10^{19}/cm^3$ with nitrogen. The drain regions 110 are interconnected in this embodiment via corresponding data/bit lines 112 extending generally in a second direction 113. In certain embodiments, the first 108 and second 113 directions are arranged substantially perpendicular to each other, such as for ease of fabrication. However, in other embodiments, the first 108 and second 113 directions intersect, but are not orthogonal.

The source lines 106 define depletion regions 114 and, in this embodiment, the characteristics of the source lines 106 and dimensions of the pillars 104 are preferably selected such that adjacent depletion regions 114 merge with each other under the pillars 104. This defines floating body regions 116 in the pillars 104 comprising p-type silicon carbide which is isolated or pinched off from the substrate 102 by the depletion regions 114. In this embodiment, lateral dimensions of the pillars 104 of approximately 100 nm and the source lines 106 formed as previously described, will provide these floating bodies 116.

Further in this embodiment, a gate dielectric 120 is formed along a first side or face of respective pillars 104 and also so as to extend at least partially over a corresponding source line 106 extending adjacent the base of the respective pillars 104. In this embodiment, the gate dielectric 120 is formed of less than 10 nm of silicon oxide. Gate/word lines 122, in this embodiment, comprising polysilicon, are formed to also extend substantially in the first direction so as to abut a corresponding portion of the gate dielectric along the first face or side of respective pillars 104.

This embodiment of the cell 100 also comprises a capacitor dielectric 124 formed along an opposite second face or side of the respective pillars 104 and along the upper surface of the substrate 102 intermediate adjacent pillars 104. In this embodiment, the capacitor dielectric 124 preferably comprises less than 10 nm of silicon oxide. In other embodiments, suitable materials for the gate dielectric 120 and/or capacitor dielectric 124 include hafnium oxide and zirconium oxide. The cell 100 also comprises body capacitor plates 126, in this embodiment comprising polysilicon, extending also generally in the first direction 108 and formed along the second sides or faces of the respective pillars 104. Further information may be found in U.S. application Ser. Nos. 10/739,253 and 10/808,058 both of which are incorporated herein in their entireties by reference.

Thus, in this embodiment, the cell 100 defines a transistor structure comprising the pillar 104 with p-type floating body 116 region, n-type source line 106 and drain region 110, gate dielectric 120, and gate/word line 122. While the cell 100 differs from conventional DRAM cells, these components do share some similar structural and operational characteristics with conventional planar and vertically arranged NMOS transistors based on silicon technologies and thus following reference will be made to an NMOS structure 130 defined by the substrate 102, the pillar 104, source line 106, drain region 110, gate dielectric 120, and gate/word line 122, for ease of operational understanding. As previously noted, it will be understood that other embodiments comprise a complementary configuration of n-type substrate and pillars and p-type source and drain regions analogous to silicon based PMOS transistors as well as combined technologies employing both types.

Figure 3:
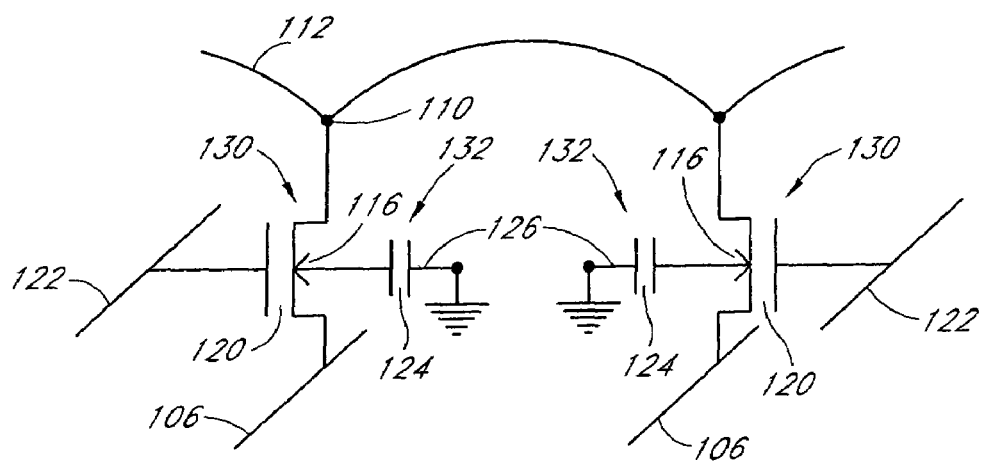
FIG. 3 is an electrical circuit diagram of the memory gain cells of FIG. 2.

A body capacitor 132 is also defined by the semi-conductive floating body 116 and conductive body capacitor plates 126 with the capacitor dielectric 124 interposed therebetween. Thus, the floating body 116 is comprised both within the NMOS structure 130 as well as the body capacitor 132. This provides both an extremely high density architecture which facilitates advancement in overall cell size reduction and corresponding increase in device count or density as well as offering operational advantages which will be described in greater detail below. FIG. 3 is an electrical circuit diagram of the embodiments of the cell 100 previously described with respect to FIG. 2. As can be seen, the floating body 116 is shared both by the body capacitors 132 and respective NMOS structures 130.

Figure 4:
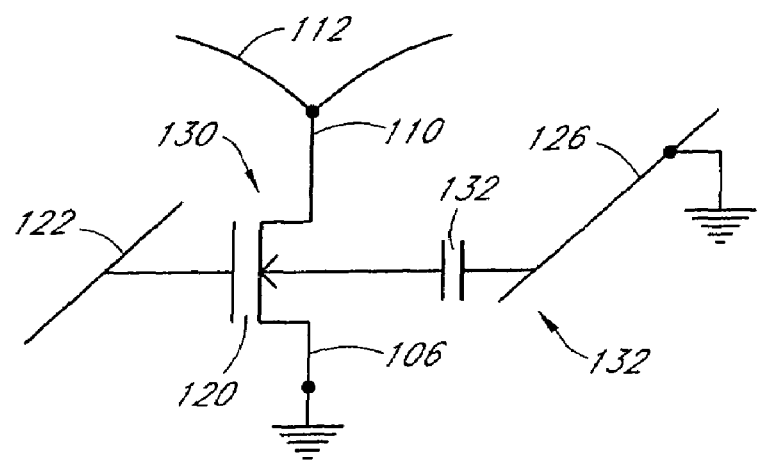
FIG. 4 is a circuit diagram of one embodiment of a single memory gain cell.

The operation of various embodiments of single cells 100 will now be explained with reference to FIGS. 4–10. FIG. 4 illustrates one embodiment of cell 100 and the operation thereof where, in this embodiment, the source line 106 is grounded as is the body capacitor plate 126. Operating bias potentials can be applied as shown in FIGS. 6 and 8–10. In this embodiment, data or a logic "one" state 134, is written onto the cell 100 by applying positive voltage to the gate 122 and the drain region 110 which is believed to cause avalanche breakdown and the floating body 116 to collect holes which are generated so as to leave a stored charge 136, as shown schematically in FIG. 8.

A standby, or hold state 140, is realized in this embodiment by placing the gate or word line 122 at a negative voltage which drives the floating body 116 to a negative potential by virtue of the capacitive coupling of the body 116 to the gate or word line 122. This reverse biases pn junctions 156, 160 defined between the floating body 116 and the drain region 110 and the source line 106 respectively so as to inhibit leakage of stored charge 136 as shown schematically in FIG. 9.

Figure 10:
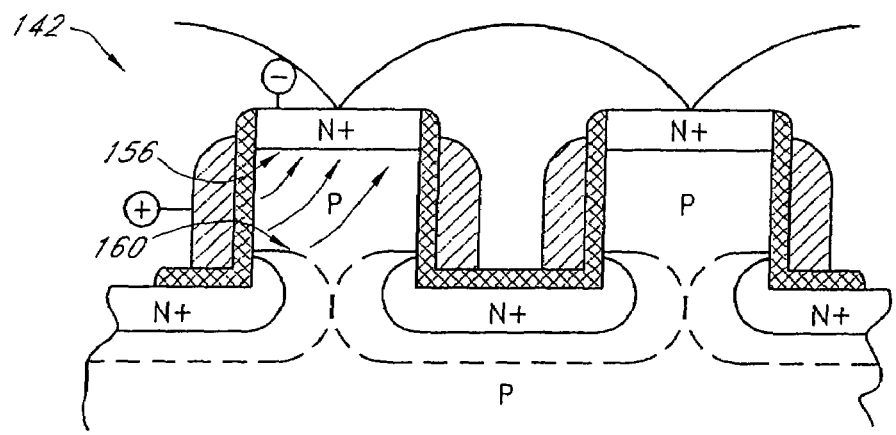
FIG. 10 illustrates the cell of FIGS. 8 and 9 with a clear or write logic "zero" condition.

The data, or logic "one" state 134, is cleared by writing a logic "zero" 142 to the cell 100 by applying a positive potential to the gate or word line 122 and biasing the drain 110 to a negative potential, as shown in FIG. 10. This forward biases the pn junction 156 between the floating body 116 and drain region 110 and removes the stored charge 136.

Figure 7:
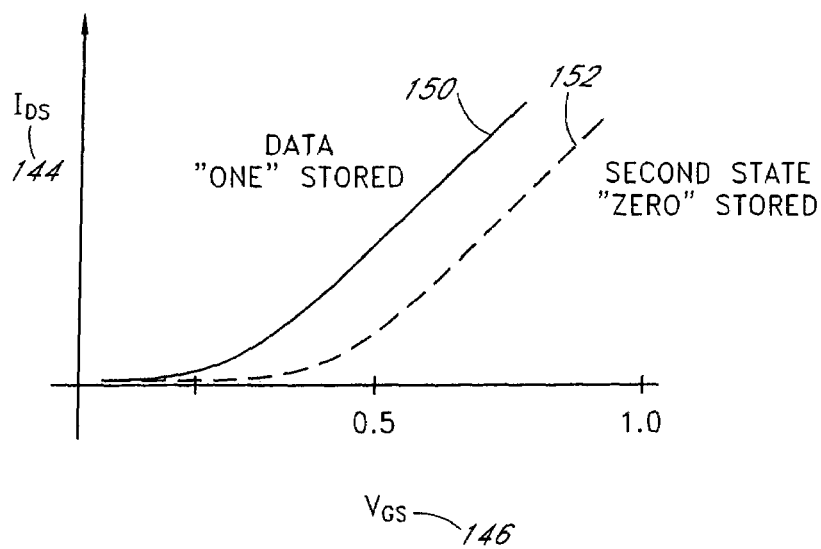
FIG. 7 illustrates parameters for read operations for embodiments of vertical memory gain cells.
Figure 8:
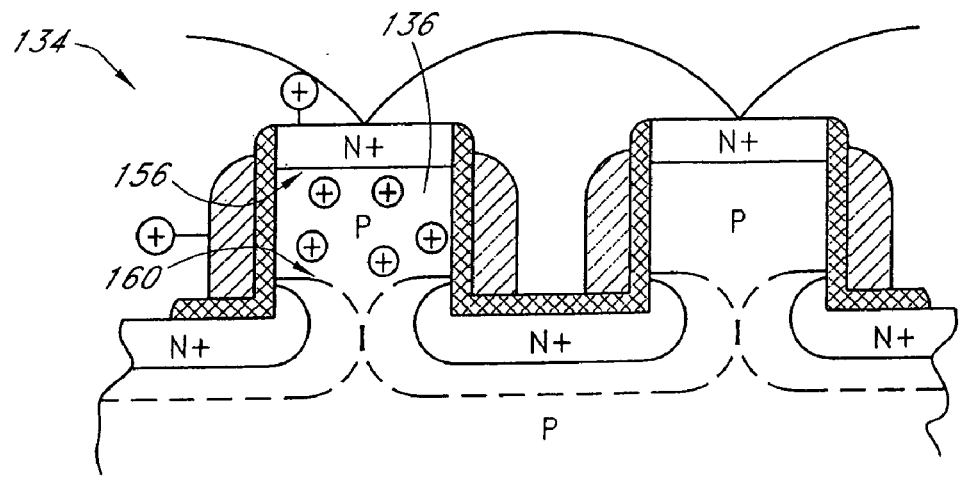
FIG. 8 illustrates one embodiment of a memory gain cell with data or a logic "one" written to the cell.
Figure 9:
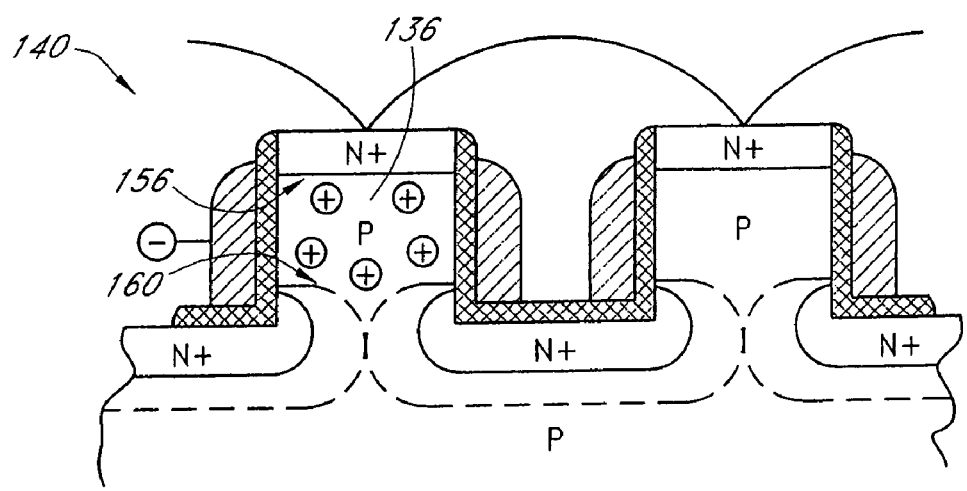
FIG. 9 illustrates the cell of FIG. 8 in a standby or hold condition.

Read operations of the cell 100 can be performed by addressing the word line 122 and determining the conductivity of the cell 100, which in this embodiment is the conductivity between the drain region 110 and source line 106. Thus, in this embodiment, a current $I_{DS}$ 144 between the drain region 110 and source line 106 of the NMOS structure 130 can be established with a potential established therebetween. The $I_{DS}$ 144 can be sensed and evaluated in a known manner with respect to an applied potential between the gate 122 and source line 106, indicated in FIG. 7 as $V_{GS}$ 146. In this embodiment, if the floating body 116 has sufficient stored charge 136 to define a data or logic "one" 134, the body 116 will have a more positive potential than otherwise. This causes a threshold voltage $V_{GS}$ 146 required to obtain a given $I_{DS}$ 144 to be lower with data or logic "one" 134 than with logic "zero" 142. Thus, as can be seen in FIG. 7, with a logic state "one" 134 stored in the cell 100, $I_{DS}$ 144 is greater at a given $V_{GS}$ 146 describing a curve $I_1$ 150. Alternatively, with a logic "zero" 142 stored in the cell 100, $I_{DS}$ 144 is correspondingly lower at a given $V_{GS}$ 146 describing a curve $I_0$ 152.

Figure 5:
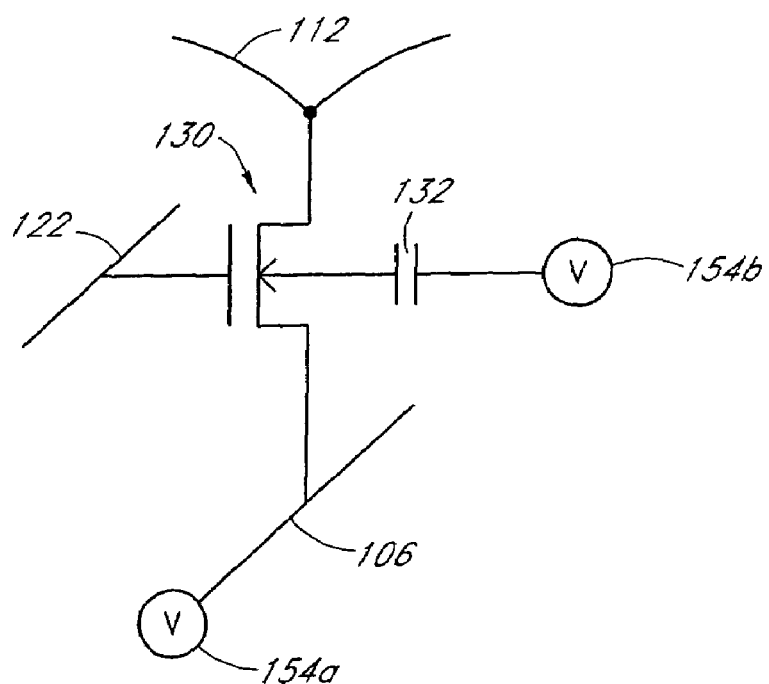
FIG. 5 is a circuit diagram of another embodiment of a single memory gain cell.
Figure 6:
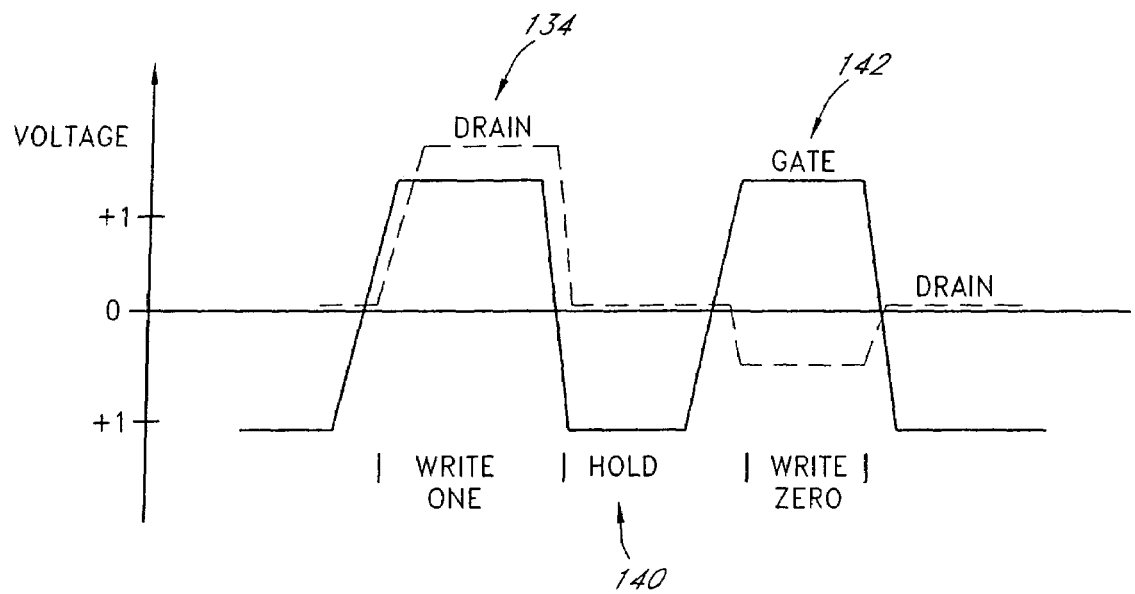
FIG. 6 illustrates parameters for write operations to embodiments of vertical memory gain cells.

Other embodiments will now be described with reference to FIG. 5. In contrast to the embodiments described with respect to FIG. 4 wherein the source line 106 and body capacitor plates 126 are grounded, in these embodiments, either or both of the source line 106 and body capacitor plate 126 are connected to variable voltage sources 154a and 154b, respectively. One specific embodiment is to drive not only the gate or word line 122, but also the body capacitor plate 126 to a negative potential during the standby or hold state 140. In this embodiment, the floating body 116 is driven to an even more negative potential during the standby or hold state 140 to further inhibit the floating body 116/drain region 110 interface defining a pn junction 156 and floating body 116/source line 106 interface defining a pn junction 160 from becoming unintentionally forward biased and draining stored charge 136.

Another embodiment is to provide a positive potential to the source line 106 by the variable voltage source 154a. This can be used in conjunction with provision of a negative voltage to the word line 122 to drive the pn junction 156 defined by the p-type floating body 116 and n-type drain region 110 interface as well as the pn junction 160 defined by the p-type floating body 116 and n-type source line 106 interface to larger reverse biases during the standby or hold state 140. This provides a back-to-back, strongly reversed bias arrangement between the pn junctions 156 and 160 which provides increased resistance against the floating body 116 becoming forward biased during the standby state 140 and thus also increased resistance to loss of charge 136 due to leakage currents. In one particular embodiment, the word line 122, body capacitor plates 126, and source line 106 are connected with parallel lines and thus all cells 100 along a given word line 122 can be simultaneously placed in a given condition, such as the standby state 140.

A similar alternative embodiment can be provided for the clear or logic "zero" state 142 by driving the word line 122 and/or the body capacitor plate line 126 to a positive potential and the source line 106 to a negative potential. In this embodiment, these lines are parallel and this will clear, or write logic "zero" 142, to all cells 100 along any given word line 122.

The higher band gap energy $E_g$ (3.25 eV vs. 1.12 eV) of the silicon carbide comprising the cells 100 compared to silicon provides further advantages against undesired loss of the stored data in the cells 100. As previously noted, the thermally dependent rate of leakage currents in silicon carbide is significantly lower than in silicon. Thus, in these embodiments, as long as appropriate negative bias is maintained at the gate conductor 122 to inhibit forward biasing the pn junctions 156 or 160, charge 136 stored in the floating body 116 will be retained significantly longer than in a comparable silicon based device. Thus, the retention time of the cells 100 is longer so as to extend the indicated intervals between refresh operations. Depending on the particular application, in certain embodiments, indicated refresh operations for the cells 100 are such that the cells can in some respects be considered non-volatile.

The cells 100, in addition to acting as memory cells 100 with long retention times as previously described, also function as gain cells 100 by providing a very high gain or amplification with respect to stored charge 136 on the floating body 116 of the cells 100. More particularly, a significant change in a threshold voltage $V_{GS}$ 146 is caused by a relatively small charge 136 stored on the floating body 116. Correspondingly, a relatively large increase (in certain embodiments a factor of greater than 100) in the number of electrons conducted between the drain region 110 and source line 106 of the cell 100, e.g. IDS 144 is realized for each stored charge 136. The gain provided by the cells 100 as well as the relatively high electron velocity ($2\times10^7$ vs. $1\times10^7$ cm/s) and breakdown field (3.0 vs. 0.25 MV/cm) of silicon carbide as compared to silicon enables relatively larger read currents and correspondingly faster read times than in comparably scaled silicon based devices.

Thus for example, during a read data operation as previously described, the NMOS structure 130 of the cell 100 can be considered as a transistor providing gain or amplification. This amplification allows a relatively small storage capacitance of the body capacitor 132 comprising the floating body 116 and body capacitor plate 126 to be effectively used and avoids the requirements for the capacitance and space requirements of a relatively large stacked capacitor structure of the prior art. These embodiments thus result in the cell 100 having a very high density with an overall area of the cell 100 of approximately $4F^2$, where F is the minimum feature size and wherein the vertical extent of the cell 100 is far less than the total height of a stacked capacitor or trench capacitor and access transistor combinations as are previously known.

An additional advantage of these embodiments is that soft error rates in the cells 100 are reduced because largely only charge, such as caused by ionizing radiation, generated in the relatively small volume of the body 116 in the pillar 104 will be collected. Charge which is generated in the substrate 102 by ionizing radiation will be collected and shorted to ground by the zero biased, or reversed biased, source lines 106, depending on the particular embodiment.

Figure 11:
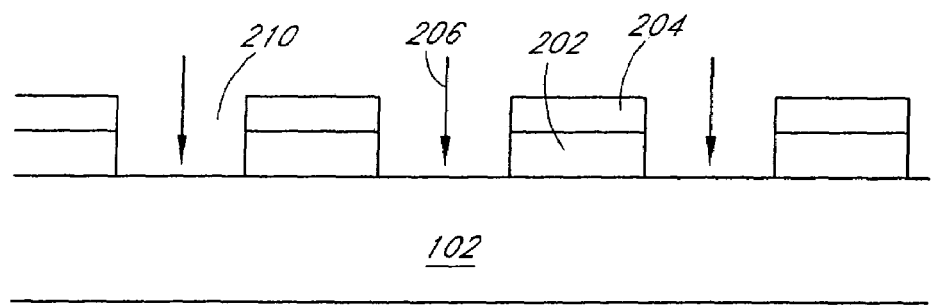
FIGS. 11 through 15 illustrate intermediate steps of embodiments of fabrication of vertical memory gain cells with long retention times.
Figure 12:
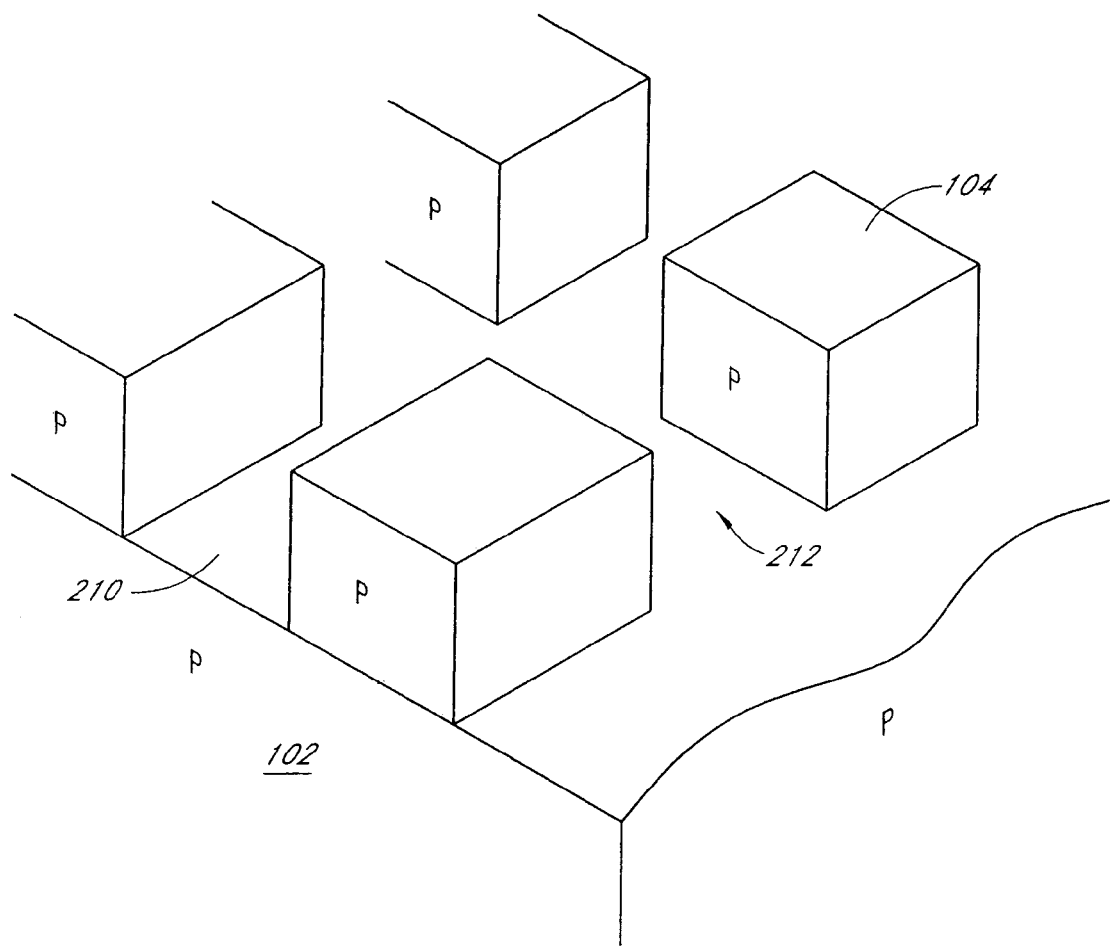

Embodiments of fabrication of the cells 100 will now be described with reference to the illustrations of FIGS. 11–15. As shown in FIG. 11, the substrate, or wafer 102, is first oxidized in an oxygen ambient at a temperature of approximately 1175° C. to provide an oxide layer 202 approximately 10 nm thick. Then a silicon nitride layer 204 is deposited to act as an etch mask. The silicon nitride mask layer 204 and underlying oxide 202 are patterned and then an anisotropic etch 206 is performed to create intersecting trenches 210 extending in the first direction 108 and trenches 212 extending in the second direction 113 as shown in FIG. 12.

The trenches 210, 212 are then filled with oxide 214 and the whole structure is planarized, in this embodiment by chemical mechanical polishing (CMP). The oxide 214 is then removed from the trenches 210 such that oxide 214 remains in regions of the trenches 212 not coincident with the trenches 210 as shown in FIG. 12. Thus, oxide 214 is interposed between adjacent pillars 104 along the first direction 108, but substantially absent along the trenches 210.

Figure 13:
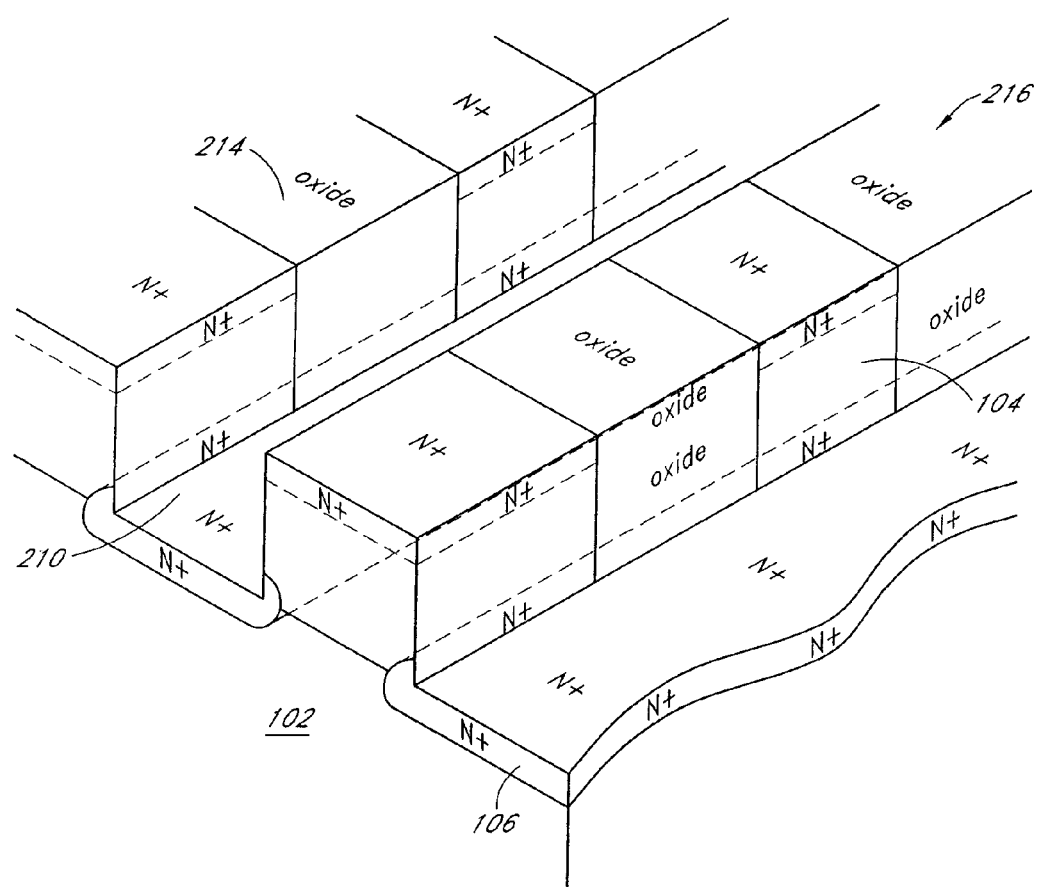

The source lines 106 are formed in the trenches 210 with the parameters previously described as illustrated in FIG. 13. The drain regions 110 are also formed in the upper regions of the pillars 104, also as previously described. The placement of the source lines 106 along the lower edges of the trenches 210 provides a simplified manufacturing process as, in one embodiment, a single implantation step can be performed to provide the n-type doping previously described so as to form both the source lines 106, positioned along the bottom of the trenches 210, as well as the drain regions 110 atop the pillars 104 in a single implantation step.

Figure 14:
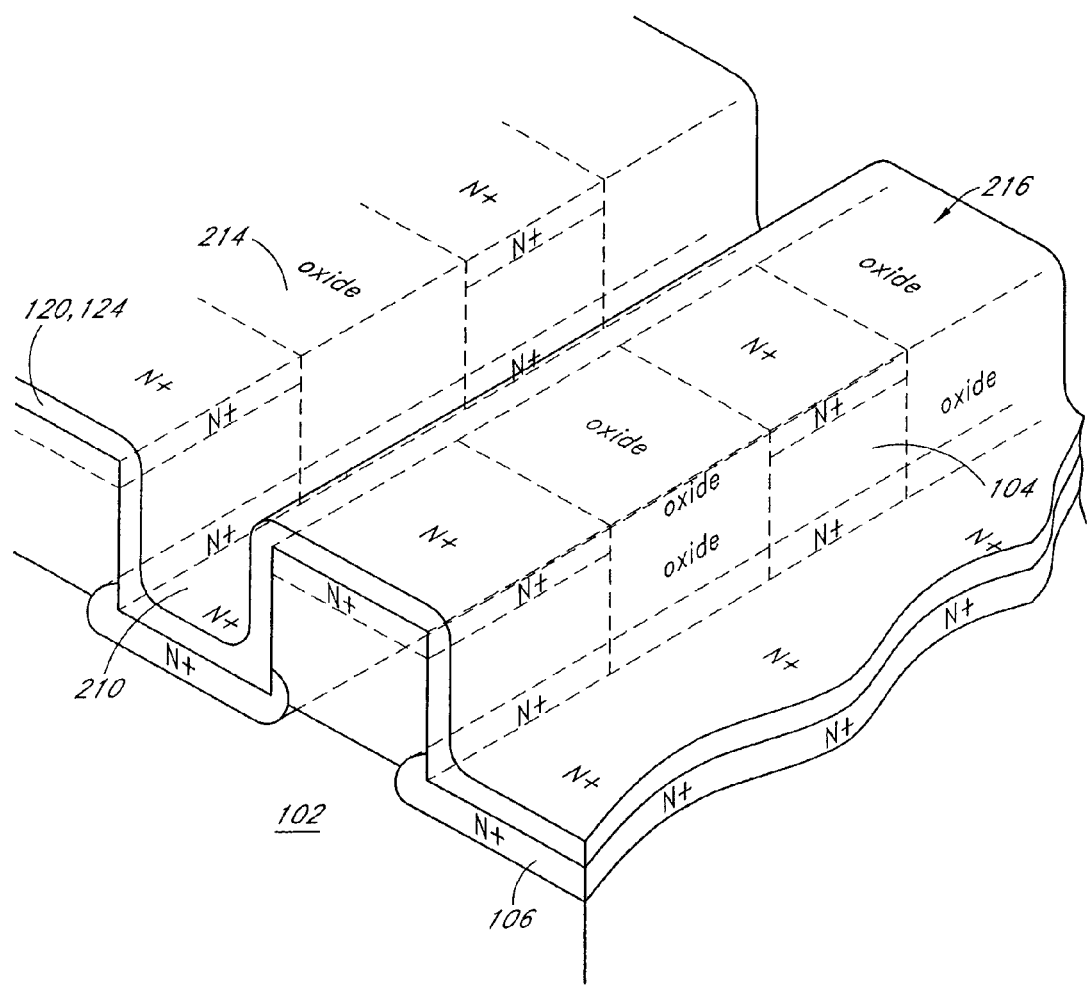
Figure 15:
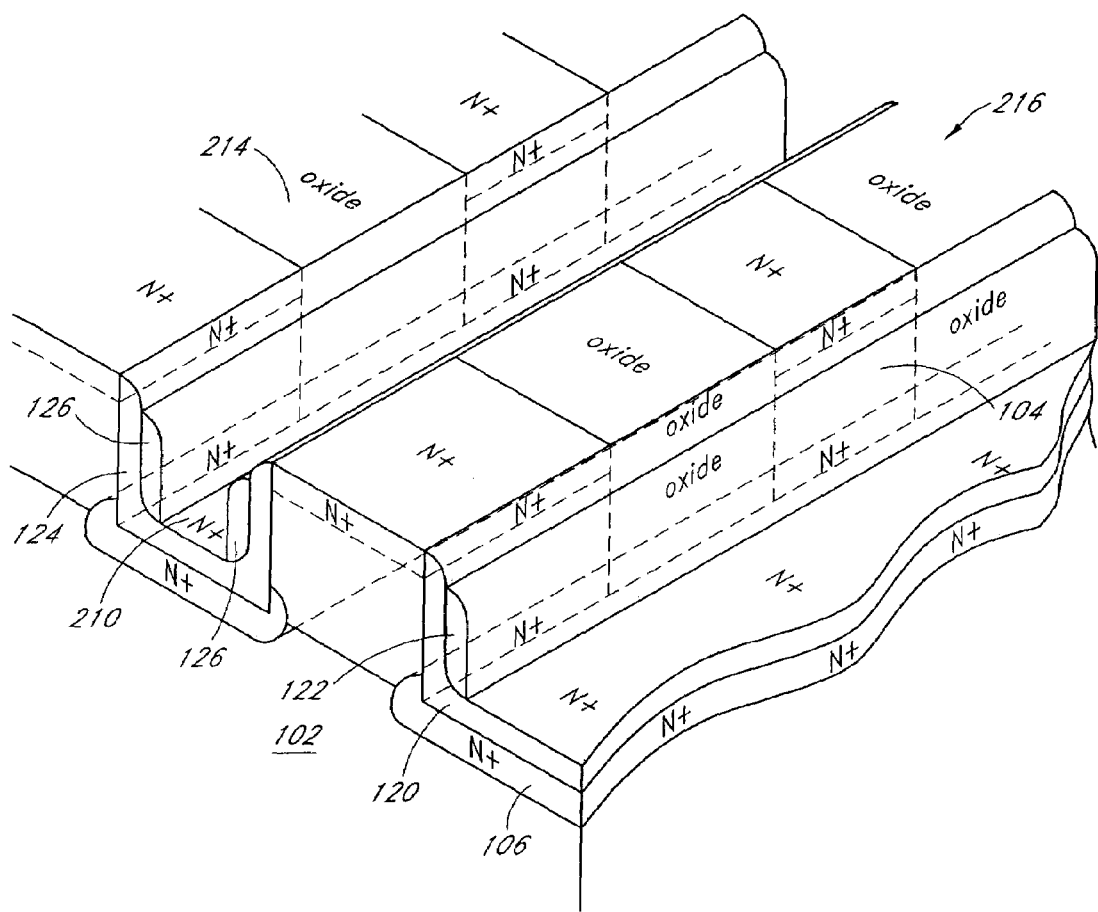

The gate dielectric 120 and capacitor dielectric 124 are formed as illustrated in FIG. 14. In this embodiment, the gate dielectric 120 and capacitor dielectric 124 are formed together. The gate/word lines 122 and body capacitor plates 126 are then formed as shown in FIG. 15. The data/bit lines 112 can also be realized by conventional metallurgy techniques. General techniques and processes adaptable for forming the embodiments of cells 100 described herein can be found in U.S. Pat. Nos. 5,936,274; 5,973,356; 5,991,225; 6,072,209; 6,097,065; 6,124,729; 6,143,636; 6,150,687; 6,153,468; and 6,238,976 which are all incorporated herein in their entireties by reference.

Thus, an array 216 of the cells 100 is provided. In this embodiment, individual cells 100 comprising the pillars 104 are positioned in the array 216 in a generally uniform rectangular arrangement defined by the intersecting trenches 210 and 212 extending generally along the first direction 108 and second direction 113, respectively. It will be appreciated, however, that in other embodiments, the arrangement of individual cells 100 in the array 216 can adopt an offset substantially rectangular arrangement or non-rectangular arrangement without detracting from the scope of the invention.

Figure 16:
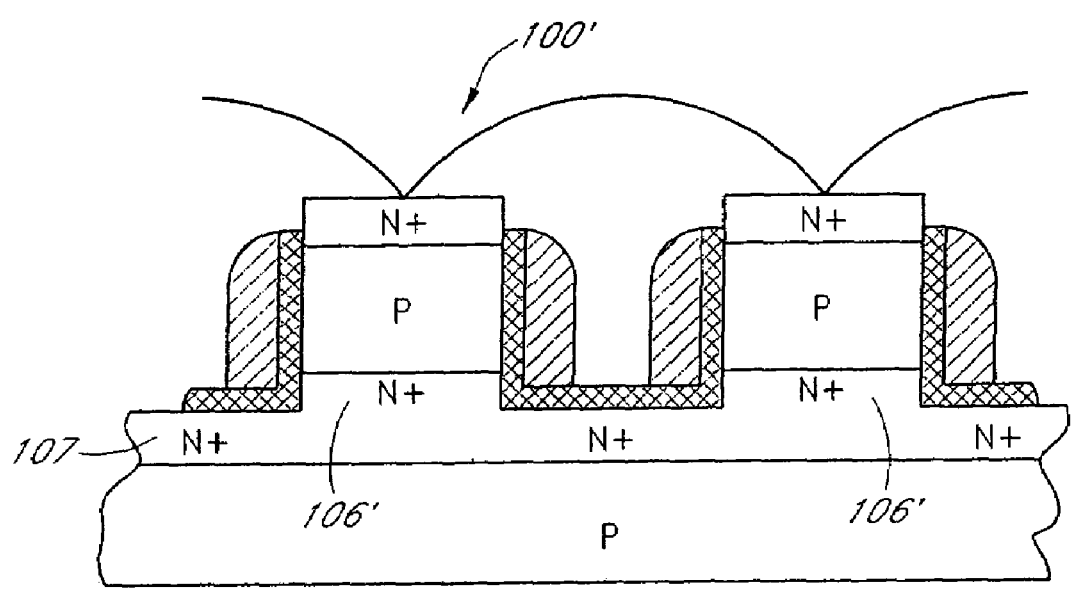
FIG. 16 is a section view of an alternative embodiment of vertical memory gain cells with long retention times.

FIG. 16 illustrates an alternative embodiment which will be indicated as cells 100'. The structure, operation, and fabrication of the cells 100' are substantially similar to those previously described for the embodiments of cells 100 previously described and the similarities will not be repeated for brevity and ease of understanding. The cells 100' primarily differ in the position and fabrication of source lines 106'. The source lines 106' differ in being located substantially underneath bases of the pillars 104 rather than substantially extending adjacent the bases and extending away therefrom as for the source lines 106.

In one embodiment, an n-type layer 107 is formed on an upper surface of the substrate 102. Then the vertically extending p-type pillars 104 are formed on top of the n-type layer 107 such that the source lines 106' are defined underlying and adjacent the bases of the pillars 104. In another embodiment, the source lines 106' can be formed by implanting the substrate 102 with nitrogen through a mask so as to form the source lines 106' at a dose of approximately $10^{15}/cm^2$ and an energy of approximately 100 keV as similarly illustrated in FIG. 11. Formation of the remaining structures of the cells 100' and the operation thereof would be substantially as previously described for the cells 100.

The embodiments of cells 100 previously described provide a particularly efficient volumetric usage of material as a single region of material, the floating body 116 comprises both a body of the NMOS structure 130, as well as the body capacitor 132. This provides both a particularly efficient use of the material comprising the cells 100, as well as providing reduced exposure for soft error occurrences, as previously described.

The cells 100 use a high band gap energy semiconductor, silicon carbide, to provide a particularly low level of leakage currents which helps provide long retention times, extending the indicated intervals between refresh operations. The cells 100 also provide both memory and gain functionality. The cells 100 are much simpler than conventional stacked capacitor or trench capacitor DRAM cells and have a shorter vertical extend. The cells 100 replace the relatively large storage capacitors which consume a significant footprint in known DRAM cells with the relatively much smaller body capacitor 132. These cells 100 further utilize the active gain of the NMOS structure 130 to amplify any stored charge 136. Specialized processes are not required for the fabrication of the cells 100 and, thus, can be implemented using standard CMOS processing techniques providing significant financial advantages for implementation of the embodiments described herein.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A method of forming memory cells comprising:

patterning and etching a substrate comprising silicon carbide doped a first conductivity type so as to form trenches extending along intersecting first and second directions so as to define a plurality of vertically extending pillars;

filling the trenches with insulator;

selectively removing the insulator from trenches extending in the first direction;

doping upper regions of the pillars and the trenches extending in the first direction with dopant of a second conductivity type so as to define drain regions and source lines respectively;

depositing gate dielectric along first sides of the pillars;

depositing capacitor dielectric along opposed second sides of the pillars;

forming conductive word lines extending along the first direction atop the gate dielectric;

forming body capacitor plates atop the capacitor dielectric; and forming data/bit lines interconnecting drain regions along the second direction.

2. The method of claim 1, wherein patterning and etching the substrate comprises forming an oxide layer and then a nitride layer and patterning the oxide and nitride layers so as to define an etch mask and performing an anisotropic etch through the mask.

3. The method of claim 1, comprising forming the trenches such that the first and second directions are substantially perpendicular to each other.

* * * * *

UNITED STATES PATENT AND TRADEMARK OFFICE
CERTIFICATE OF CORRECTION

PATENT NO. : 7,151,024 B1  
APPLICATION NO. : 11/215880  
DATED : December 19, 2006  
INVENTOR(S) : Leonard Forbes It is certified that error appears in the above-identified patent and that said Letters Patent is hereby corrected as shown below:

Title Page, Item (56)

Page 2

(Other Publications), line 5, delete "peformance" and insert -- performance --.

In the Drawings

Sheet 4 of 11, FIG. 7, delete ""ONE"" and insert -- "ONE" --

Sheet 4 of 11, FIG. 7, delete ""ZERO"" and insert -- "ZERO" --

Column 8

Line 32, Delete "IDS" and insert -- $I_{DS}$ --

Signed and Sealed this

Twentieth Day of May, 2008

JON W. DUDAS  
*Director of the United States Patent and Trademark Office*